(12) United States Patent
Deshpande et al.

(10) Patent No.: US 10,671,793 B1
(45) Date of Patent: Jun. 2, 2020

(54) EDITING OF LAYOUT DESIGNS FOR FIXING DRC VIOLATIONS (71) Applicant: Cadence Design Systems, Inc., San Jose, CA (US)

(72) Inventors: Devendra Deshpande, Noida (IN); Gerard Tarroux, Saint Paul (FR); Chun-Wen Chiang, Toufen (TW); Sheng-Wei Lin, Beijing (CN); Vandana Gupta, Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/051,358

(22) Filed: Jul. 31, 2018

(51) Int. Cl.
*G06F 30/398* (2020.01)
*G06F 3/0484* (2013.01)
*G06F 30/392* (2020.01)

(52) U.S. Cl.
CPC ........ *G06F 30/398* (2020.01); *G06F 3/04842* (2013.01); *G06F 30/392* (2020.01)

(58) Field of Classification Search
CPC ............ G06F 17/5081; G06F 17/5072; G06F 3/04842; G06F 30/398; G06F 30/392
See application file for complete search history.

(56) References Cited

U.S. PATENT DOCUMENTS

| | | | | |
|---|---|---|---|---|
| 6,453,452 B1 * | 9/2002 | Chang | ................. | G06F 17/5068 430/5 |
| 6,470,489 B1 * | 10/2002 | Chang | ...................... | G03F 1/36 430/5 |
| 6,560,766 B2 * | 5/2003 | Pierrat | ................ | G06F 17/5081 716/103 |
| 6,735,752 B2 * | 5/2004 | Manoo | ................ | G06F 17/5081 430/5 |
| 7,096,447 B1 * | 8/2006 | Li | ........................ | G06F 17/5081 716/112 |
| 7,155,440 B1 * | 12/2006 | Kronmiller | ......... | G06F 17/5068 707/797 |
| 7,302,672 B2 * | 11/2007 | Pack | ........................ | G03F 1/36 430/5 |
| 7,461,359 B1 * | 12/2008 | Nequist | ............... | G06F 17/5068 716/104 |
| 7,506,277 B1 * | 3/2009 | Arora | .................. | G06F 17/5081 716/122 |
| 7,665,045 B1 * | 2/2010 | Nequist | ............... | G06F 17/5045 716/104 |

(Continued)

*Primary Examiner* — Nha T Nguyen
(74) *Attorney, Agent, or Firm* — Foley & Lardner LLP (57) ABSTRACT The present embodiments relate to providing an overlap view of external and internal components of all instance circuit cells related to a master circuit cell in a same layout view. A layout of a circuit having a plurality of instance circuit cells of a master circuit cell is provided. Further, a graphical user interface including a user selectable option for an overlay view is provided. In addition, responsive to the selection of the overlay view, the plurality of instance circuit cells of the master circuit cell is determined. In addition, a plurality of sets of circuit elements, each set of circuit elements including external circuit elements that overlap with a corresponding instance circuit cell of the plurality of instance circuit cells is determined. Further, the plurality of sets of circuit elements overlaid on the master circuit cell is displayed on the layout view.

20 Claims, 10 Drawing Sheets (56) References Cited

U.S. PATENT DOCUMENTS

| | | | | |
|---|---|---|---|---|
| 7,793,238 B1* | 9/2010 | Rabkin | G06F 17/5081 | |
| | | | | 703/1 |
| 8,046,730 B1* | 10/2011 | Ferguson | G06F 17/5068 | |
| | | | | 716/100 |
| 8,079,006 B2* | 12/2011 | Yamasaki | G06F 17/5081 | |
| | | | | 703/19 |
| 8,479,137 B2* | 7/2013 | Lo | G06F 17/50 | |
| | | | | 716/118 |
| 8,510,685 B1* | 8/2013 | Rossman | G06F 17/5068 | |
| | | | | 716/50 |
| 8,539,416 B1* | 9/2013 | Rossman | G06F 17/5081 | |
| | | | | 716/118 |
| 8,732,640 B1* | 5/2014 | Krishnan | G06F 17/5068 | |
| | | | | 716/110 |
| 8,875,064 B2* | 10/2014 | Aggarwal | G06F 17/5081 | |
| | | | | 716/106 |
| 9,141,746 B1* | 9/2015 | Ginetti | G06F 17/5068 | |
| 9,740,811 B2* | 8/2017 | Chen | G06F 17/5072 | |
| 9,846,759 B2* | 12/2017 | Chen | G06F 17/5077 | |
| 9,965,579 B2* | 5/2018 | Park | G06F 17/5081 | |
| 9,971,861 B2* | 5/2018 | Behnen | G06F 17/5072 | |
| 10,223,495 B1* | 3/2019 | Agrawal | G06F 17/5081 | |
| 10,354,034 B1* | 7/2019 | Agrawal | G06F 17/5068 | |
| 10,354,037 B1* | 7/2019 | Ginetti | G06F 17/5072 | |
| 2002/0152449 A1* | 10/2002 | Lin | G06F 17/5081 | |
| | | | | 716/52 |
| 2003/0023939 A1* | 1/2003 | Pierrat | G06F 17/5081 | |
| | | | | 716/53 |
| 2003/0088837 A1* | 5/2003 | Pierrat | G06F 17/5081 | |
| | | | | 716/106 |
| 2005/0132320 A1* | 6/2005 | Allen | G06F 17/5068 | |
| | | | | 716/103 |
| 2005/0172252 A1* | 8/2005 | Cheng | G06F 17/5072 | |
| | | | | 716/124 |
| 2006/0075371 A1* | 4/2006 | Kamat | G06F 17/5068 | |
| | | | | 716/122 |
| 2006/0090146 A1* | 4/2006 | LeBritton | G06F 17/5081 | |
| | | | | 716/52 |
| 2007/0079266 A1* | 4/2007 | Devineni | G06F 17/5081 | |
| | | | | 716/112 |
| 2008/0086708 A1* | 4/2008 | Rittman | G06F 17/5081 | |
| | | | | 716/52 |
| 2010/0205576 A1* | 8/2010 | Majumder | G06F 17/5081 | |
| | | | | 716/122 |
| 2010/0287519 A1* | 11/2010 | Su | G06F 17/5072 | |
| | | | | 716/122 |
| 2011/0061034 A1* | 3/2011 | Ginetti | G06F 17/5068 | |
| | | | | 716/104 |
| 2012/0047479 A1* | 2/2012 | Paris | G06F 17/5081 | |
| | | | | 716/112 |
| 2012/0192135 A1* | 7/2012 | Gullette | G06F 17/5081 | |
| | | | | 716/113 |
| 2012/0304139 A1* | 11/2012 | Chen | G06F 17/5072 | |
| | | | | 716/111 |
| 2013/0275938 A1* | 10/2013 | Bendicksen | G06F 17/5081 | |
| | | | | 716/139 |
| 2013/0290834 A1* | 10/2013 | Ginetti | G06F 17/5068 | |
| | | | | 715/243 |
| 2015/0324510 A1* | 11/2015 | Aggarwal | G06F 17/5081 | |
| | | | | 716/112 |
| 2015/0339430 A1* | 11/2015 | Nifong | G06F 17/5072 | |
| | | | | 716/112 |
| 2017/0339581 A1* | 11/2017 | Macdonald | G06F 17/5081 | |

* cited by examiner

EDITING OF LAYOUT DESIGNS FOR FIXING DRC VIOLATIONS

TECHNICAL FIELD

The present disclosure relates generally to integrated circuits, including but not limited to methods and apparatuses for providing schematic layout views of integrated circuit designs.

BACKGROUND

Electronic design automation (EDA) tools are used to design integrated circuits. Integrated circuits can include many thousands and perhaps millions of circuit elements (e.g., transistors, logic gates, diodes) and interconnecting wires and busses. The circuit elements and wires can be formed on many different layers, with various interconnections (e.g., vias) between layers. EDA tools allow a designer to describe an integrated circuit based on its desired behavior on a schematic, and then transform that schematic into a set of geometric shapes called a layout which forms the circuit elements and wires for all the different layers.

SUMMARY

The present embodiments relate to reconfiguration of a layout. According to some aspects, embodiments relate to a method. The method can include providing a layout of a circuit having a plurality of instance circuit cells of a master circuit cell. The method further includes providing a graphical user interface including a user selectable option for an overlay view. The method also includes, responsive to selection of the user selectable option for an overlay view, determining the plurality of instance circuit cells of the master circuit cell. The method further includes determining a plurality of sets of circuit elements, each set of circuit elements including external circuit elements that overlap with a corresponding instance circuit cell of the plurality of instance circuit cells. The method also includes displaying on the layout view the plurality of sets of circuit elements overlaid on the master circuit cell.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

The design of integrated circuits involves several design stages. At least one these design stages includes checking whether the design of the integrated circuit meets design rules specified for the particular technology and fabrication process on which the integrated circuit is to be implemented. A design rule check (DRC) can determine whether a physical layout of the design of the integrated circuit satisfies a series of design rules. A design tool can provide a designer with the ability to run a DRC on the designed integrated circuit and indicate on a graphical user interface, such as a layout view, any design rule violations or DRC errors. Example DRC rules can specify one or more aspects structures in a layout in relation to a single layer or in relation to structures in the layout in relation to multiple layers. For example, single layer DRC rules can include a width rule that specify a minimum width of any shape in the layout. Single layer DRC rules can also include a spacing rule that specifies a minimum spacing between two shapes. Multiple layer DRC rules can include an enclosure rule that specifies that a shape of one type, such as, for example, a contact or a via, must be covered with some additional margin by a metal layer. Any shape in the layout that violates one or more of the specified DRC rules may generate DRC error when a DRC is performed. The designer can then modify the design in layout view to mitigate or avoid the indicated design rule violations.

The integrated circuit may include several instance circuit cells that are instances of a master circuit cell. The master circuit cell can, for example, be listed in a standard cell library or a custom cell library. A designer/user can instantiate the same master circuit cell into one or more instance circuit cells, each one of which is identical, in structure and function, to the master circuit cell. For example, the instance circuit cells can include the same internal components in the same order or orientation as that of the master circuit cells. For example, a master circuit cell may include a standard or custom built NAND gate. The designer/user can instantiate one or more NAND gates and position the instances of the NAND gate at different parts of the integrated circuit 102. The designer can modify in the layout view the layout of the internal components of an instance circuit cell to mitigate any associated DRC errors. However, changing the layout of the instance circuit cell may also change the layout of the master circuit cell. The changes in the layout of the master cell would be reflected to all other instance circuit cells that are instances of that master circuit cell. As a result, while the designer may have mitigated the design rule violations associated with one particular instance circuit cell, the changes in the layout of the master circuit cell may cause design rule violations to appear at other instance circuit cells. A designer would then have to review in the layout view the other instance circuit cells that cause DRC errors and make modifications while ensuring that the modification does not cause DRC errors in other instance circuit cells. In addition, the design of the integrated circuit may include hundreds or thousands of instance circuit cells and master circuit cells. The process of converging to a design layout that mitigates design rule violations in all instance circuit cells may take a long time, thereby delaying the design process.

A technical solution to the above mentioned technical problem is discussed below. In particular, a design tool can provide a graphical user interface with a layout view in which two or more instance circuit cells that are instances of the master circuit cells are provided, shown, displayed and/or rendered in an overlap view. In the overlap view, external circuit elements that are either connected to the more than one instance circuit cells or that cause a DRC error in relation to the more than one instance circuit cells are shown in a single overlapped view. This allows the designer to modify one or more components of the master circuit cell, and view any resulting DRC errors at the two or more instance circuit cells in a single view and at a single location. Thus, the designer does not have to, after each modification to the master circuit cell, view each instance circuit cell individually to correct any resulting DRC errors. In addition, the design tool can provide a graphical user interface that lists all the instance circuit cells associated with a master circuit cell. The graphical user interface provides the user a panned and zoomed view of each instance circuit cell selected by the designer.

Figure 1:
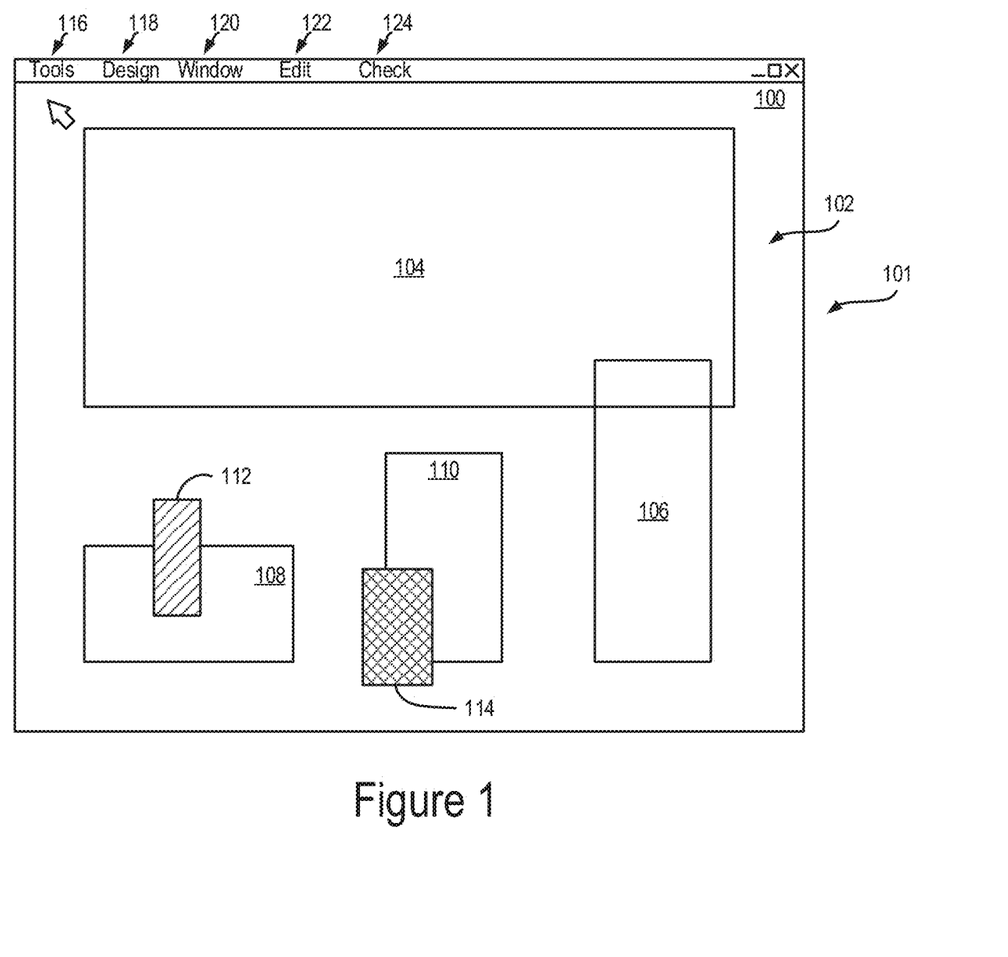
FIG. 1 shows an example graphical user interface displaying a layout view 100 of a design of an integrated circuit according to present embodiments.

FIG. 1 shows an example graphical user interface 101 displaying a layout view 100 of a design of an integrated circuit 102. In particular, the layout view 100 shows a layout of the integrated circuit 102. The integrated circuit 102 includes a first circuit block 104, a second circuit block 106, a first instance circuit cell 108, and a second instance circuit cell 110. The first instance circuit cell 108 and the second instance circuit cell 110 can be instances of a single master circuit cell. For example, a master circuit cell could be a NAND gate, and the first instance circuit cell 108 and the second instance circuit cell 110 can be instances of the NAND gate embodied in the master circuit cell. In some examples, the first instance circuit cell 108 and the second instance circuit cell 110 can be placed in the design of the integrated circuit 102 by selecting the NAND gate from a circuit cell library, and placing the NAND gates in the layout of the integrated circuit 102. For example, the graphical user interface (GUI) 101 can allow the designer to pick two instances: the first instance circuit cell 108 and the second instance circuit cell 110, of the master circuit cell form the cell library, and place the first and second instance circuit cells 108 and 110 in the integrated circuit 102.

The integrated circuit 102 also includes a first external circuit element 112 and a second external circuit element 114. The first external circuit element 112 overlaps a perimeter of the first instance circuit cell 108, and the second external circuit element 114 overlaps a perimeter of the second instance circuit cell 110. The first external circuit element 112 and the second external circuit element 114 are external to the first instance circuit cell 108 and the second instance circuit cell 110. That is, the first external circuit element 112 and the second external circuit element 114 may not be a component of the master circuit cell associated with the first instance circuit cell 108 and the second instance circuit cell 110. In some examples, the first and the second external circuit elements 112 and 114 may represent circuit components, such as, for example, wires, interconnects, metal layers, polysilicon layer, other instance circuit cells, or any other component or layer that can be used as a component in the integrated circuit 102. In some examples, at least one of the first external circuit element 112 and the second external circuit element 114 may generate a DRC error in relation to the first instance circuit cell 108 and the second instance circuit cell 110, respectively. For example, the position of the first external circuit element 112 in relation to the first instance circuit cell 108 may be such that a DRC error may be generated when the designer runs a DRC.

While FIG. 1 shows only one external circuit element associated with each of the first and second instance circuit cells 108 and 110, in some implementations or designs, there may be more than one external circuit element that overlaps a perimeter of the instance circuit cells. The integrated circuit 102 may include sets of external circuit elements associated with the instance circuit cells, where each set of external circuit elements may overlap one or more instance circuit cells. Each set of external circuit elements may include one or more external circuit elements. In some examples, an external circuit element overlapping an instance circuit cell can include the external circuit element, the perimeter of which either abuts or intersects with the perimeter of the instance circuit cell. In some examples, an external circuit element overlapping an instance circuit cell can include the external circuit element that causes a DRC error in relation to the instance circuit cell. For example, an external circuit element may be adjacent to but not intersecting with the perimeter of the instance circuit cell. However, the external circuit element may be close enough to the instance circuit cell to cause a DRC error, such as, for example, a spacing rule error.

The layout view 100 may show a single hierarchical level of the design of the integrated circuit 102. For example, the layout view 100 in FIG. 1 shows the highest hierarchical level of the design of the integrated circuit 102. However, integrated circuit 102 can include multiple hierarchical levels. For example, one hierarchical level down, the first circuit block 104 may include a sub-circuit with one or more instances of circuit cells. The sub-circuit may also include a third instance circuit cell (not shown), which like the first instance circuit cell 108 and the second instance circuit cell 110, can also be an instance of the same master circuit cell. In some examples, the GUI 101 can allow the designer to select a circuit block to view deeper in the hierarchy. The GUI 101 can provide selectable menu options, such as, a Tools button 116, a Design (or File) button 118, a Window button 120, an Edit button 122, and/or a Check button 124. The GUI 101 can include additional buttons for various other functions, but are not shown for sake of simplicity. The Tools button 116, for example, can allow the designer to open various tools, such as "Find and Replace" to allow finding object(s) of one or more desired criteria. The Design (or File) button 118, for example can allow the designer to select a design to be opened, or to create a new design. The Window button 120, for example, can allow the designer to select window options for viewing the integrated circuit 102, such as to select between already opened windows, or to copy a given window and create another window. The Edit button 122 can provide the designer with selectable options to edit the design of the integrated circuit 102. For example, clicking on the Edit button 122 can open a list of options, such as, an Edit-in-Place (EIP) menu, a Hierarchy menu, and the like. The EIP menu, for example, when selected can allow the designer to edit a circuit component selected by the designer on the layout view 100. A designer, for example, can select the first instance circuit cell 108 for EIP. The GUI 101 may highlight the circuit component selected for EIP. The Hierarchy menu, when selected, can bring up another user interface (discussed below) that can list all the instances of a selected circuit cell, as well as options for generating an overlap view. The Check button 124, for example, can provide a DRC check menu, the selection of which can allow a designer to run a DRC on the design of the integrated circuit 102 shown on the layout view 100.

Figure 2:
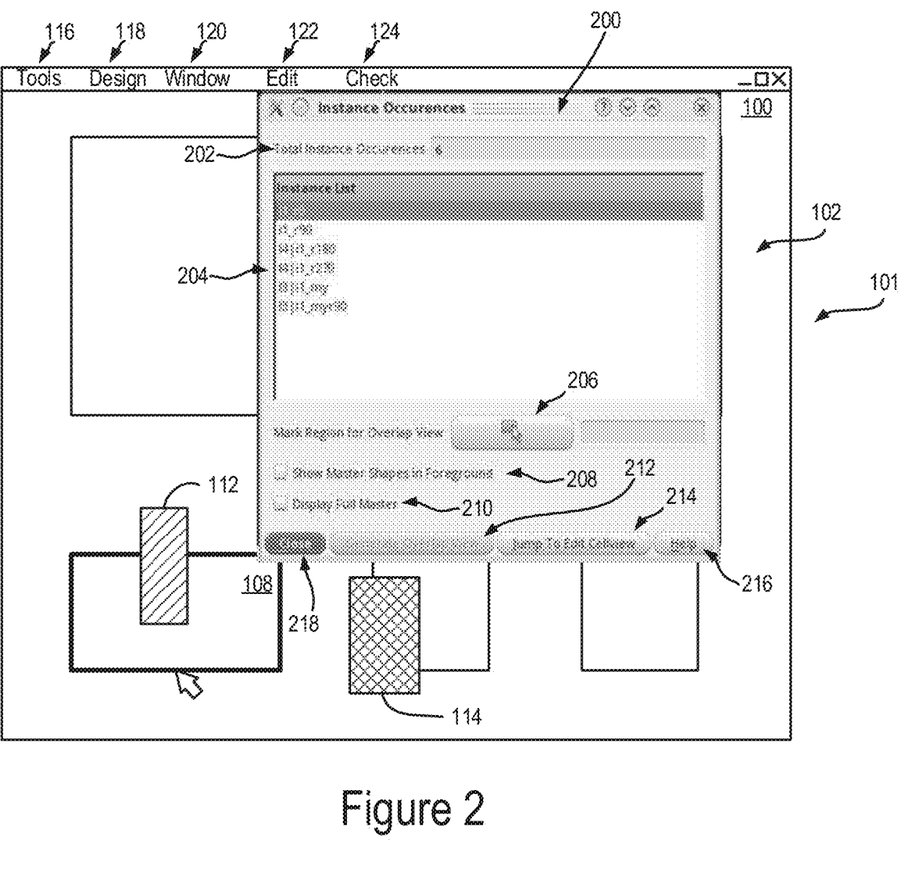
FIG. 2 shows an example instance occurrences graphical user interface (GUI), according to the present embodiments.

FIG. 2 shows an example GUI 200 for identifying and/or providing instance occurrences (also referred to herein as instance occurrences GUI). The instance occurrences GUI 200 can be invoked by selecting one of the menu options. For example, the designer can invoke the instance occurrences GUI 200 by clicking on the Edit button 122, and then selecting a Hierarchy menu (not shown). The instance occurrences GUI 200 can include information regarding the instance circuit cells related to the selected instance circuit cell, as well as options to view and edit master circuit cells related to the selected instance circuit cells. For example, the instance occurrences GUI 200 can include a "Total instance occurrences" count 202, an "instance list" 204, a "mark region for overlap view" button 206, a "show master shapes in foreground" selection box 208, a "display full master" selection box 210, a "close" button 218, a "generate overlap view" button 212, a "jump to edit cellview" button 214, and a "help" button 216.

The total instance occurrences count 202 can identify the total number of instance circuit cells of the master circuit cell associated with the selected instance circuit cell occur in the integrated circuit 102. For example, the instance occurrences GUI 200 displays "6" as the number of instance circuit cells that are instances of the master circuit cell associated with the first instance circuit cell 108, which is selected by the designer. The instance list 204 lists the identities of the instance circuit cells that are instances of the same master circuit cell of which the selected instance circuit cell is an instance. For example, the instance list 204 lists the identities of six instance circuit cells. As an example, "i1" indicates the master cell identity, and the instance list 204 lists the instances circuit cells that are the instances of the master circuit cell "i1." The instance list 204 also indicates the hierarchical level at which each instance circuit cell is located. For example, the first two identities "i1_r0" and "i1_r90" indicate the instance circuit cells occurring at the highest hierarchical level. For example, the identities "i1_r0" and "i1_r90" may correspond to the first instance circuit cell 108 and the second instance circuit cell 110, both of which are shown as occurring on the highest hierarchical level. The identities with the indicator "I4" and "I3" indicate that the particular instance is located within a hierarchical level or block (circuit design block) that is not the highest hierarchical level, for example, within an I4 hierarchical level (or block) and within an I3 hierarchical level (or block), respectively. Of course, other identities and names can be used to identify the instance circuit cells and the master circuit cells within the integrated circuit 102.

The instance list 204 can be generated by accessing a cell database associated with the integrated circuit that includes a list of all instances and circuit elements of the integrated circuit 102. For example, the database can be searched for the identity of a selected circuit cell, such as the first instance circuit cell 108. The database can return the identity of the master circuit cell, and all other instances of the master circuit cell in the integrated circuit. The GUI 200 can display the list of instance circuit cells including information regarding the hierarchical level at which the instance circuit cells are instantiated. The GUI 200 may also display a filtered list, where the filtered list includes only those instance circuit cells that are at or above a designer/user selected hierarchical level. The hierarchical level can be selected using, for example, the menu options on the GUI 101. In some examples, the user may specify the hierarchical level when initially opening the layout view 100 of the integrated circuit 102. In some examples, a netlist of the integrated circuit 102 may also be searched to determine the identities of the instance circuit cells associated with master circuit cells.

Figure 3:
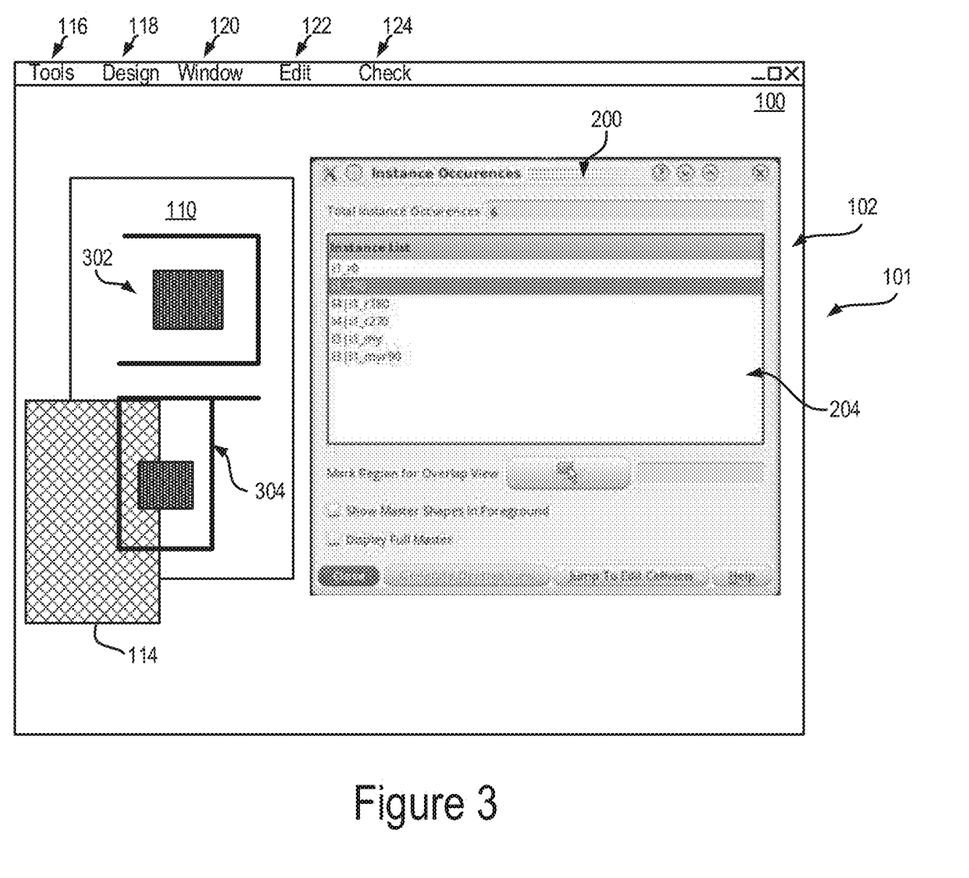
FIG. 3 shows an example panning of a layout view in response to a selection of an instance circuit cell from a list of instance circuit cells in the instance occurrences GUI shown in FIG. 2.

The instance occurrences GUI 200 can also provide the ability, upon selection of an instance circuit cell on the instance list 204, to pan to the selected instance circuit cell in the layout view 100. FIG. 3 shows an example panning of the layout view in response to a selection of an instance circuit cell from the list of instance circuit cells in the instance occurrences GUI 200 shown in FIG. 2. As mentioned above, the identity "i1_90" listed in the instance list 204 can correspond to the second instance circuit cell 110. Upon the user selection of the identity "i1_90," the GUI 101 can alter the layout view 100 such that the view pans to and zooms into the second instance circuit cell 110, such that the second instance circuit cell 110 is in full view. In some examples, the GUI 101, in response to the selection of the identity of the second instance circuit cell 110 in the instance list 204, may alter the layout view 100 such that the perimeter of the second instance circuit cell 110 occupies the entire area of the layout view 100. In some examples, the GUI 101 may only pan, and not zoom, to the location of the selected instance circuit cell. In some instances, the GUI 101 may pan and center the instance circuit cell on the layout view 100. In some examples, the GUI 101 can also display the internal components of the selected instance circuit cell. For example, as shown in FIG. 3, the GUI 101 displays the internal components, i.e., a first internal component 302 and a second internal component 304 of the second instance circuit cell 110. The GUI 101 may also display the internal components of the selected instance circuit cell in the foreground. In some examples, the GUI 101 may display the external components, such as the second external circuit element 114, in the foreground, and the internal components of the second instance circuit cell 110 in the background. The instance occurrences GUI 200 or the GUI 101 can provide selectable menus or buttons to allow the user to select one or more of the above mentioned display options. Internal components of an instance cell can include those components that belong to the instance circuit cell. In relation to the instance circuit cell, components that do not belong to the instance circuit cells can be external components. The external components, however, may belong to other instance circuit cells. Thus, the first external circuit element 112 and the second external circuit element 114 are external component in relation to both the first and second instance circuit cells 108 and 110. Internal and external components may include shapes corresponding to various circuit elements such as wires, vias, capacitors, resistors, or other structures.

Figure 4A:
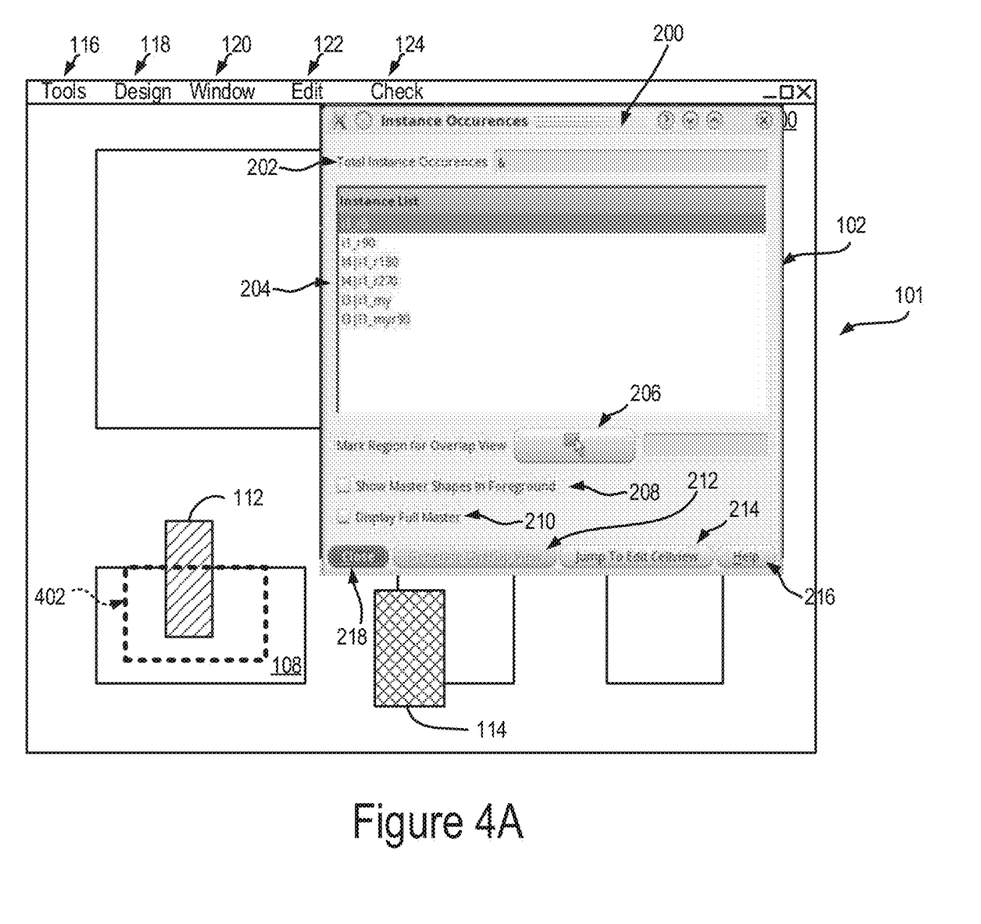
FIG. 4A shows an example GUI that allows the user to select a search area on or around an instance circuit cell for an overlap view, according to the present embodiments.

The instance occurrences GUI 200 can also provide the ability to display an overlap view of all the instance circuit cells associated with a master cell. FIG. 4A shows an example GUI that allows the user to select a search area on or around an instance circuit cell for an overlap view. In particular, the instance occurrences GUI 200 includes the mark region for overlap view button 206, the selection of which, allows the user to select a search area around on or around the selected instance circuit cells over which an overlap view is desired. As an example, as shown in FIG. 4A, the user selects a search area 402 over which an overlap view is desired. The designer can then click on the Generate overlap view button 212 to generate an overlap view within the desired search area.

Figure 4B:
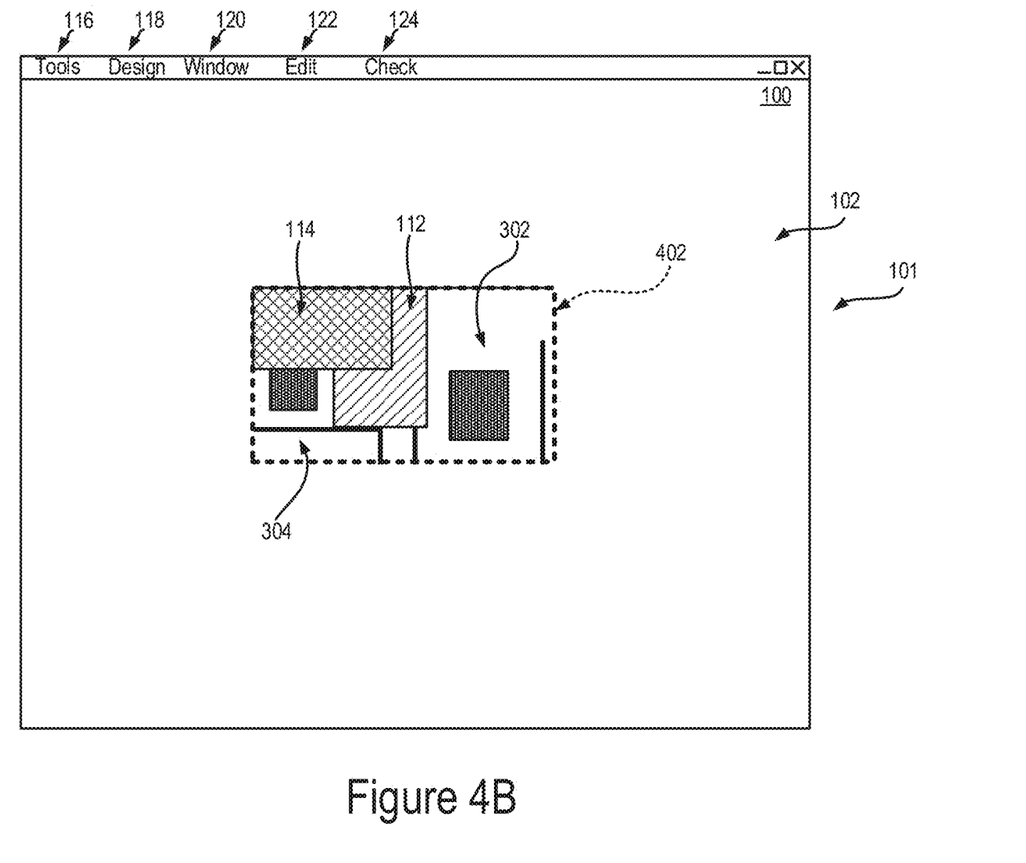
FIG. 4B shows the resulting overlap view displayed by the GUI in response to the user selecting a search area shown in FIG. 4A.

FIG. 4B shows the resulting overlap view displayed by the GUI 101 in response to the user selecting the search area 402 shown in FIG. 4A for instance. In particular, FIG. 4B shows the search area 402 and all the components both external and internal to the selected instance circuit cell. For example, the a portion of the first instance circuit cell 108, including a portion of the first internal component 302 and a portion of the second internal component 304 that lie within the search area 402 is displayed. In addition, a portion of the first external circuit element 112 and a portion of the second external circuit element 114 that lie within the search area 402 are shown. In determining the components to display, the GUI 101 can first determine the coordinates of the search area in relation to the perimeter of the selected first instance circuit cell 108. The GUI 101 can then crop the shapes of the internal components of the first instance circuit cell 108 (or the master circuit cell associated with the first instance circuit cell 102) and reproduce the cropped shapes of the internal components within the layout view 100. In addition, the GUI 101 can determine the coordinates of each external component within the integrated circuit 102 that is adjacent to each instance circuit cell (such as those listed in the instance list 204 shown in FIG. 2) and crop the portions of those external components that lie within the search area positioned in relation to the corresponding instance circuit cell. The GUI 101 can reproduce the cropped shapes of the external components also in the layout view 100.

It should be noted that in situations where one or more instance circuit cells are oriented in different direction from the selected instance circuit cell (such as, for example, the second instance circuit cell 110 which is rotated 90 degrees in relation to the first instance circuit cell 108), the GUI 101 can first reorient all the instance circuit cells and the corresponding external components in the same orientation prior to cropping. Thus, as shown in FIG. 4B, the second external circuit element 114 is shown in an orientation that would result if the second external circuit component and the second instance circuit cell 110 were to be rotated 90 degrees clockwise before cropping. While FIG. 4B shows the external components associated only with the first instance circuit cell 108 and the second instance circuit cell 110, it is understood that the GUI 101 can show the external components associated with all the instance circuit cells listed in the instance list 204 shown in FIG. 2.

In some examples, the GUI 101 or the instance occurrences GUI 200 can provide the designer with a selection of the hierarchical level to which the overlap view should be generated. For example, if the designer were to select only the highest hierarchical level (i.e., that shown in FIG. 1), then the resulting overlap view would be similar to that shown in FIG. 4B, where external circuit components associated with only the first instance circuit cell 108 and second instance circuit cell 110 are shown.

Figure 4C:
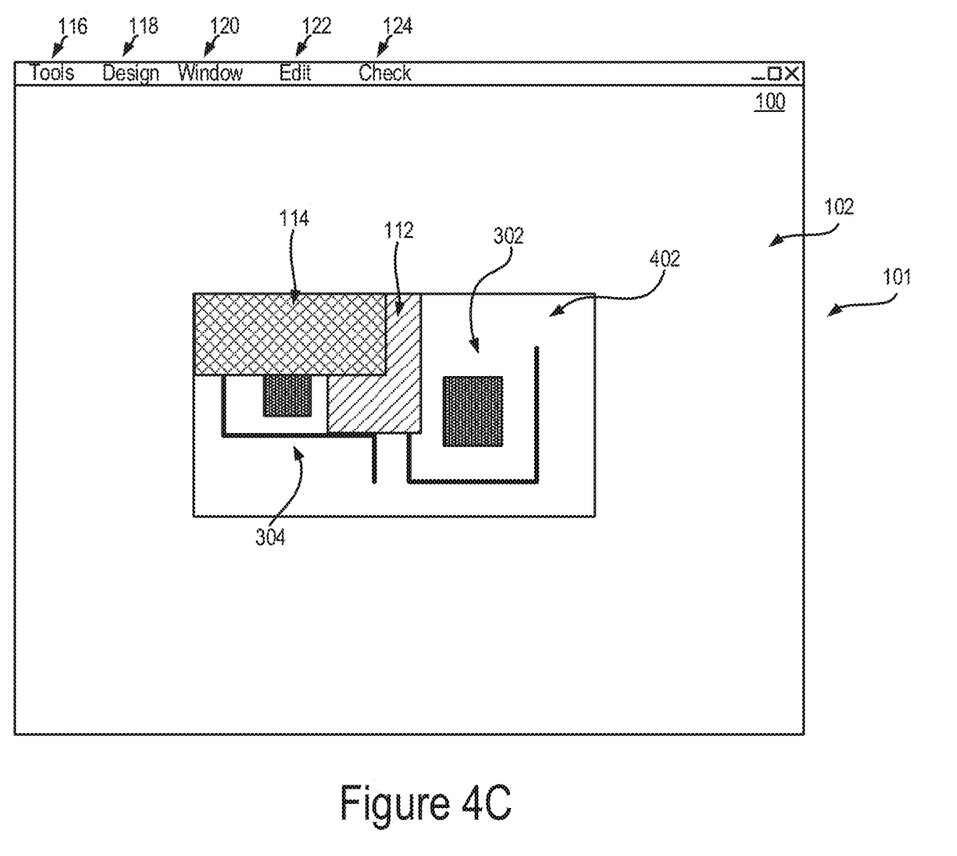
FIG. 4C shows an overlap view in which the search area includes a perimeter of an instance circuit cell, according to the present embodiments.
Figure 4D:
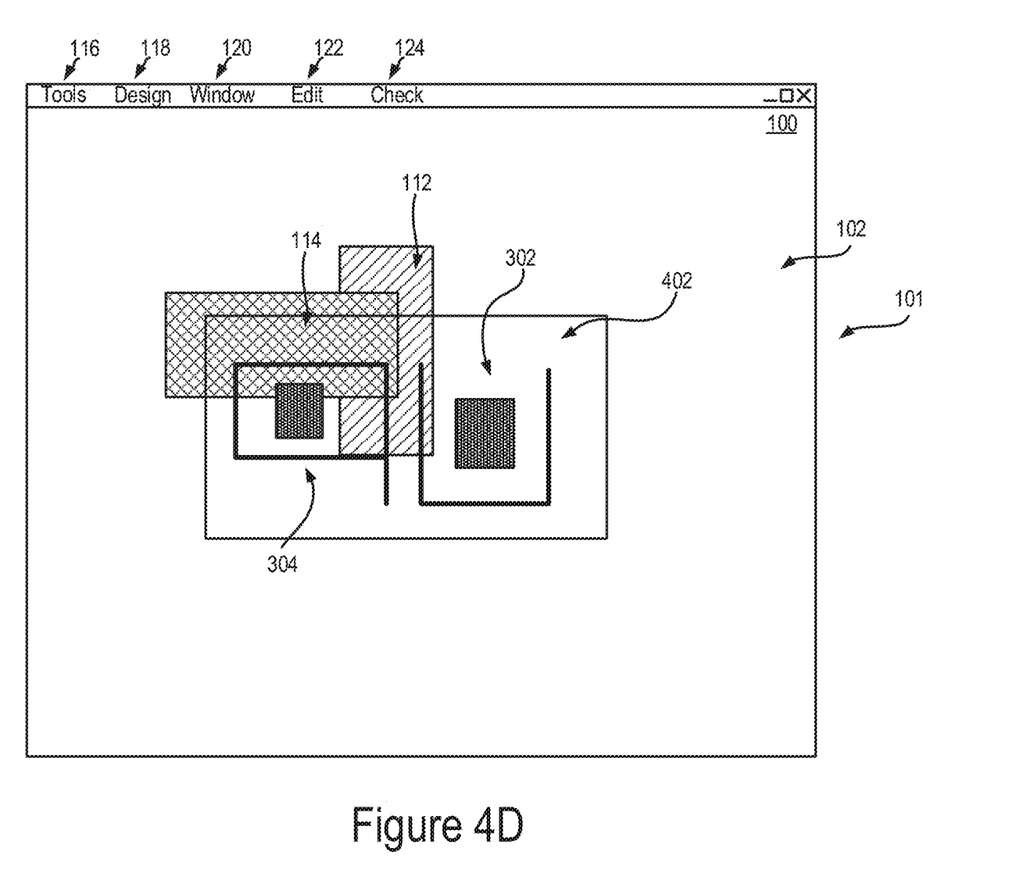
FIG. 4D shows an overlap view in which the search area is larger than a perimeter of an instance circuit cell, according to the present embodiments.

The instance occurrences GUI 200 can also provide the user the ability to display an overlap view within a search area that includes the entire instance circuit cell. For example, the designer can click on the Display Full Master selection box 210 to limit the search area to include the entire instance circuit cell. FIG. 4C shows an overlap view in which the search area includes the perimeter of the instance circuit cell. In some examples, selecting the Display Full Master selection box 210 can cause the GUI 101 to select a search area that is greater than the perimeter of the selected instance circuit cell. For example, the search area can be expanded by about 10% or 20% of the area of the selected instance circuit cell. For example, FIG. 4D shows an overlap view in which the search area is greater than a perimeter of the instance circuit cell. For example, the search area is large enough to include the entirety of the first external circuit element 112 and the second external circuit element 114 within the overlap view. In addition, FIG. 4D shows the internal components of the master circuit cell in the foreground. The instance occurrences GUI 200 can generate the view shown in FIG. 4D in response to the designer selecting the Show Master Shapes In Foreground selection box 208.

In the overlap view, as shown in FIG. 4B-4D, the designer can view all the external components that have or may cause a DRC error at one location. Thus, if the designer decides to edit the master circuit cell associated with the instance circuit cell, the designer can select the EIP menu option and edit the master circuit cell within the layout view 100 shown in FIGS. 4A, 4B and 4C. One way of editing the master circuit cell can be to reposition (or resize) one or more internal components, such as the first internal component 302 and the second internal component 304. When the internal components of the master circuit cells are repositioned (or resized), the DRC errors that may occur in all visible hierarchical levels can be seen in one view. As a result, the designer does not have to switch to individual views of each instance circuit cell in each hierarchical level to check whether a modification of the master circuit cell at one instance circuit cell to mitigate a DRC error has caused a DRC error at another instance circuit cell.

In some examples, the designer may determine to modify the external components instead of, or in addition to, modifying the master circuit cell to address DRC errors. Referring to the layout views shown in FIGS. 4C and 4D, the designer can select one or more external components, such as the first external circuit element 112 or the second external circuit element 114 for editing-in-place. After selecting the external component, the designer can reposition or resize the external component to address any DRC errors.

Figure 5:
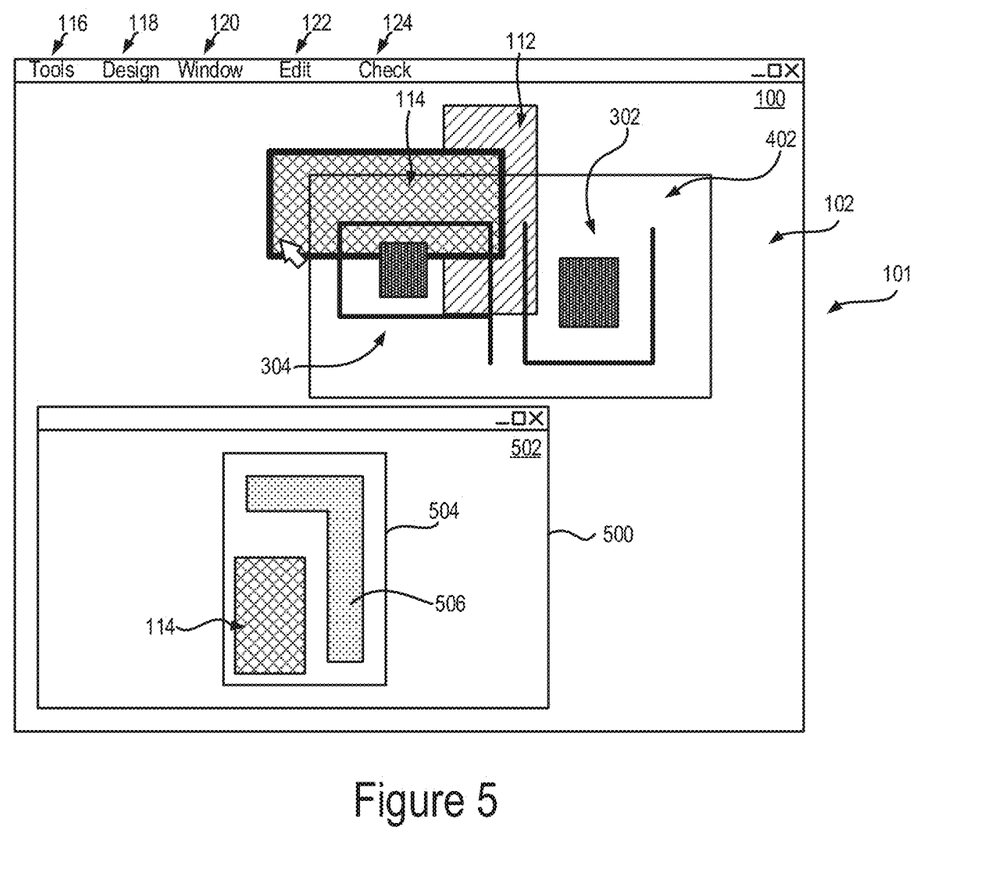
FIG. 5 shows an additional layout view that includes a circuit cell associated with an external component selected in an overlap view, according to the present embodiments.

In some examples, the designer can select an external component for editing, and subsequently select a menu option that opens up a circuit cell corresponding to the external component for editing in an additional view or window. For example, the GUI 101 can provide an option, the selection of which can cause the GUI 101 to open an additional window, or a separate view within the same window, that includes a circuit cell associated with the selected external component. The GUI 101 can provide the option via any one of the menu options such as, for example, the Tools button 116, the Design button 118, the Window button 120, the Edit button 122, and the Check button 124. FIG. 5 shows an additional layout view 502 that includes a circuit cell associated with an external component selected in an overlap view. For example, the designer may select the second external circuit element 114 in the overlap view shown in the layout view 100. The designer may then select an option using a menu option, such as, for example, pressing the Window button 120, provided by the GUI 101 to open a new window 500, which can display details of the second external circuit element 114 and an associated circuit cell 504. The circuit cell 504 may also include additional circuit elements such as an internal circuit element 506. The designer/user can reposition or resize the second external circuit element 114 as well as the internal circuit element 506 of the circuit cell 504. The GUI 101 can reflect any changes made to the position or the size or the shape of the second external circuit element made on the layout view 502 to the overlap view shown on the layout view 100. In this manner, the designer can receive real-time feedback on any DRC errors that may result in the overlap view due to the changes made in the new window 500.

Figure 6:
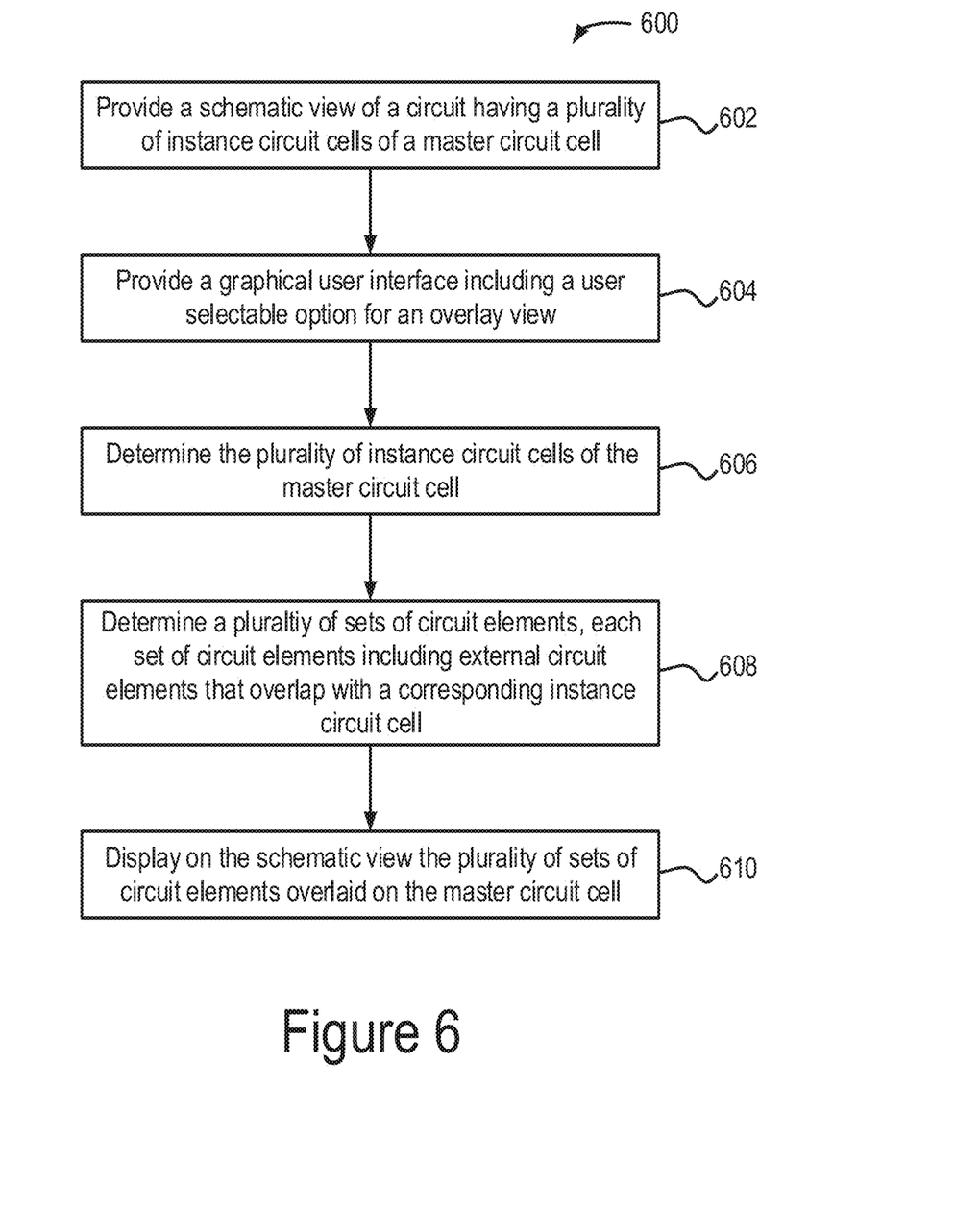
FIG. 6 shows a flow diagram of a process for generating an overlap view of circuit elements for a design rule check (DRC), according to the present embodiments.

FIG. 6 shows a flow diagram of a process 600 for generating an overlap view of circuit elements for a DRC. The process includes providing a layout view of a circuit having a plurality of instance circuit cells of a master circuit cell (602). At least one example of this process stage has been discussed above in relation to FIGS. 1-5. For example, FIG. 1 shows a layout view 100 that displays a layout of an integrated circuit 102, which includes a first instance circuit cell 108 and a second instance circuit cell 110. The first and second instance circuit cells 108 and 110 are instances of the same master circuit cell. The layout view 100 shows the layout of the integrated circuit 102 at one of several possible hierarchical levels. The hierarchical level can be selected using, for example, the menu options on the GUI 101. In some examples, the user may specify the hierarchical level when initially opening the layout view 100 of the integrated circuit 102. Other hierarchical levels of the integrated circuit 102 may include additional instance circuit cells that are also instances of the master circuit cell. The integrated circuit 102 can include several different instance circuit cells that are instances of their respective master circuit cells.

The process 600 further includes providing a graphical user interface including a user selectable option for an overlay view (604). At least one example of this process stage has been discussed above in relation to FIGS. 2-5. For example, FIG. 2 shows a graphical user interface 101 and a graphical user interface 200. The GUI 200 includes a Generate Overlap View button 212, the selection of which can cause the GUI 101 and the GUI 200 to generate an overlay view.

The process 600 also includes determining a plurality of instance circuit cells of the master circuit cell (606). At least one example of this process stage has been discussed above in relation to FIGS. 2-5. For example, FIG. 2 shows a GUI 200 which provides an instance list 204 that includes the identities of the instance circuit cells associated with a single master circuit cell. The instance list 204 can be associated with a selected instance circuit cells, such as the first instance circuit cell 108 selected in FIG. 2. The GUI 200 can determine the master circuit cell associated with the selected first instance circuit cell 108, and determine all the other instance circuit cells that are instances of the master circuit cell. The GUI 200 can display the instance circuit cells in the instance list 204. In some examples, the instance list 204 may display the identities of only those instance circuit cells that are at or above a hierarchical level specified by the designer.

The process 600 includes determining a plurality of sets of circuit elements, each set of circuit elements including external circuit elements that overlap with a corresponding instance circuit cell (608). At least one example of this process stage has been discussed above in relation to FIGS. 2-5. For example, FIG. 4B shows two sets of external circuit elements associated with the two instance circuit cells. The first set of external circuit elements can include the first external circuit element 112 that overlaps with the first instance circuit cell 108, and the second set of external circuit elements can include the second external circuit element 114 that overlaps with the second instance circuit cell 110. The GUI 200 can access a layout design database associated with the integrated circuit 102 that includes the positions of each of the circuit elements of the integrated circuit 102. The GUI 200 can determine the coordinates of the perimeter of each instance circuit cell and determine the identities of other circuit elements of the integrated circuit 102 that overlap with the instance circuit cell.

The process further includes displaying on the layout view the plurality of sets of circuit elements overlaid on the master circuit cell (610). At least one example of this process stage has been discussed above in relation to FIGS. 2-5. For example, as shown in FIG. 4A-4D, the GUI 200 or GUI 101 can show the selected instance circuit cell 108, or the master circuit cell associated with the first instance circuit cell 108 and portions of the first and second external circuit elements 112 and 114 in an overlay view. The overlay view can be based on a search area specified by the designer. For example, the search area can be a portion of the instance circuit cell, the entire instance circuit cell, or an area that is larger than the instance circuit cell.

Figure 7:
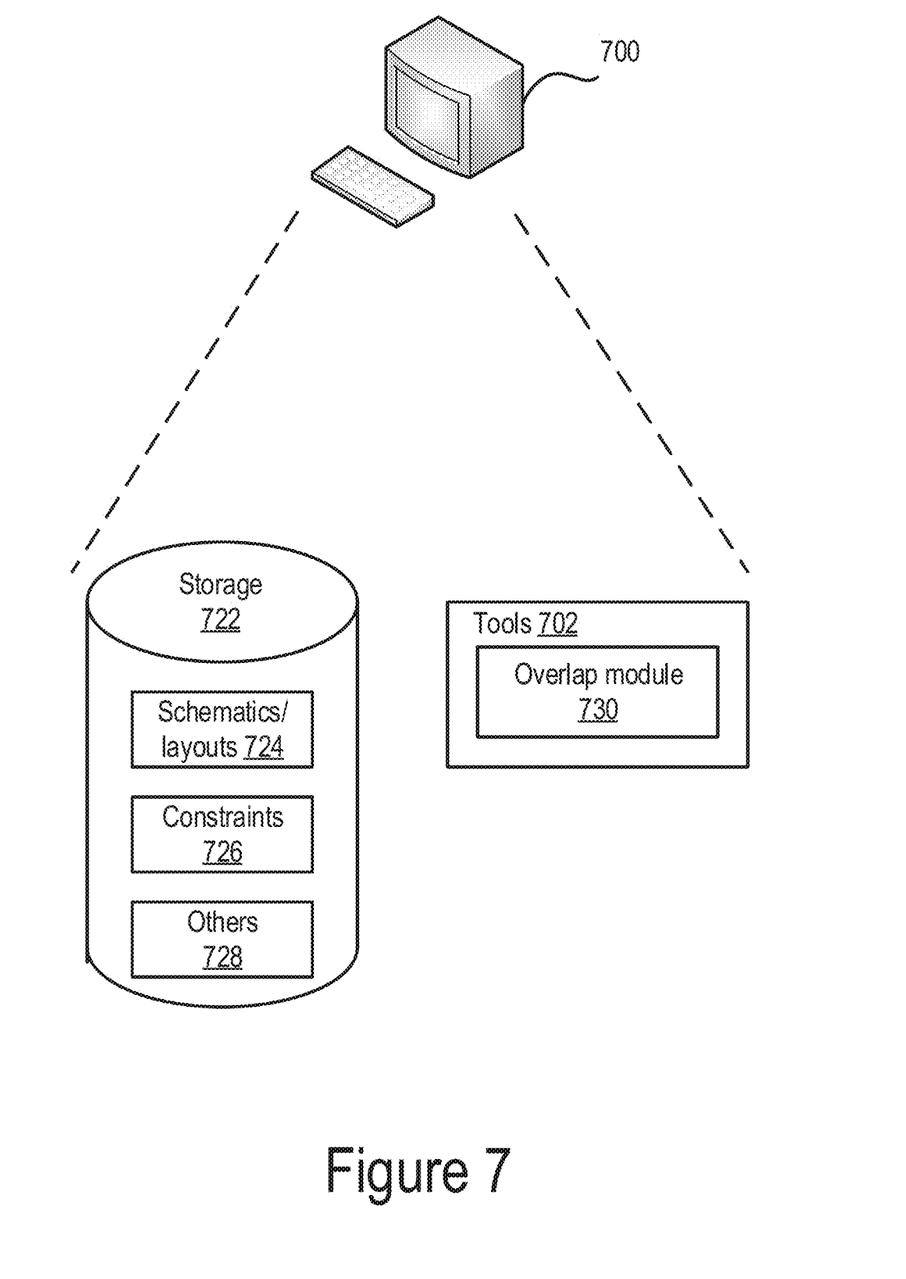
FIG. 7 is a functional block diagram illustrating an example system according to the present embodiments.

FIG. 7 is a functional block diagram of an example system for using overlap view design rule check in an integrated circuit design according to the present embodiments. In some embodiments, the system 700 can be one or more computers that are loaded with software (e.g., EDA tools) and/or customized to include hardware for interactively and/or automatically implementing designs of integrated circuits (e.g., ASICs, SOCs, full custom digital ICs). In some embodiments, the one or more computing systems 700 comprise various components not shown such as processor(s) or processor core(s), memory, disks, etc. The software and/or custom hardware may include interactive or automated modules such as a placer, a routing engine, a layout editor, a wire editor, a design rule checker, a verification engine, a module generator, and/or a floor-planner, as will be appreciated by those skilled in the art.

In one or more embodiments, the computing system 700 may further write to and read from a local or remote volatile or non-volatile computer accessible storage 722 that stores thereon data or information such as, but not limited to, one or more databases such as post-placement layouts, schematic design database(s) or physical design database(s) 1024 (e.g., GDS II or OASIS data, etc.), libraries, rule decks, constraints (e.g., track specifications, minimum spacing, pitch/width requirements, widths, BCB rules), etc. 726, and/or other information or data 728 (e.g., trim shape locations) that may be required to support the methodology of the present embodiments. According to certain aspects, design rules in storage 726 are extendable or changeable (e.g., via APIs and the like) without changing other components or data in system 700.

In some embodiments, the one or more computing systems are implemented in a "cloud" configuration and/or a client/server configuration. For example, one or more server computers may be loaded with application software (e.g., a router and/or other EDA tool) for implementing some or all of the methodology of the present embodiments, and one or more client computers can communicate with the server computer(s) via a network to perform some or all of the methodology of the embodiments for a particular design.

In some embodiments, the one or more computing systems 700 may, by various standalone software, hardware modules or combinations thereof 702 (e.g., EDA tool), include an overlap module 730 that identifies shapes of internal and external circuit components in relation to instance circuit cells and master circuit cells to generate an overlap view for DRC checks. The overlap module 730 may also execute functionality discussed above in relation with the instances occurrences GUI 200 and the GUI 101 shown in FIGS. 1-4C. It should be noted that the overlap module 730 may be implemented by adapting or communicating with certain pre-existing modules (e.g., placer, router, layout editor, design rule checker) as may be required to implement a methodology to implement design rule correct IC designs according to the present embodiments and as described above. Those skilled in the art will be able to understand how to implement various examples of such modules after being taught by the present disclosure.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method comprising:
   providing a layout view of a circuit having a plurality of instance circuit cells of a master circuit cell;
   providing a graphical user interface including a user selectable option for an overlay view; and
   responsive to selection of the user selectable option for an overlay view:
      determining the plurality of instance circuit cells of the master circuit cell,
      determining a plurality of sets of circuit elements, each set of circuit elements including external circuit elements that overlap with a corresponding instance circuit cell of the plurality of instance circuit cells, and
      displaying on the layout view at least a portion of shapes of the plurality of sets of circuit elements overlaid on the master circuit cell.

2. The method of claim 1, further comprising:
   providing a graphical user interface including a user selectable option for a search area on the layout; and
   responsive to selection of the user selectable option for the search area:
      determining a perimeter of the search area, and
      displaying on the layout view a portion of the plurality of sets of circuit elements overlaid on the master circuit cell that lies within the search area.

3. The method of claim 1, further comprising:
   providing a graphical user interface including a user selectable option for selecting a hierarchical level of the circuit; and
   responsive to selection of the hierarchical level of the circuit:
      displaying on the layout view only those sets of circuit elements, of the plurality of sets of circuit elements, overlaid on the master circuit cell that are included in hierarchical levels at and above the selected hierarchical level of the circuit.

4. The method of claim 1, further comprising:
   providing a graphical user interface including a user selectable option for viewing the master circuit cell in a foreground; and
   responsive to selection of the user selectable option for viewing the master circuit cell in the foreground:
      displaying on the layout view elements of the master circuit cell over the plurality of sets of circuit elements.

5. The method of claim 1, further comprising:
   providing a graphical user interface including a user selectable option for displaying a full master view; and
   responsive to selection of the user selectable option for displaying the full master view:
      displaying on the layout view a portion of the plurality of sets of circuit elements overlaid on the master circuit cell that lies within an area that corresponds to a perimeter of the master circuit cell.

6. The method of claim 1, further comprising:
   providing a graphical user interface with a list of identities of the plurality of instance circuit cells; and
   responsive to selection of an identity of a selected instance circuit cell of the plurality of instance circuit cell:
      panning the layout view to include a portion of the circuit including the selected instance circuit cell.

7. The method of claim 1, further comprising:
   providing a graphical user interface that allows user selection of a set of circuit elements from the plurality of sets of circuit elements displayed on the layout view; and
   responsive to selection of the set of circuit elements from the plurality of sets of circuit elements:
      panning the layout view to include the selected set of circuit elements and the corresponding instance circuit cell of the plurality of instance circuit cells.

8. The method of claim 1, wherein each set of the circuit elements includes at least one external circuit element that causes a design rule check error in relation to the respective instance circuit cell of the plurality of instance circuit cells.

9. A system for designing an integrated circuit, comprising one or more processors, the one or more processors configured to:
   display on a display screen a layout view of a circuit having a plurality of instance circuit cells of a master circuit cell;

display on the display screen a graphical user interface including a user selectable option for an overlay view; and responsive to selection of the user selectable option for an overlay view:

determine the plurality of instance circuit cells of the master circuit cell, determine a plurality of sets of circuit elements, each set of circuit elements including external circuit elements that overlap with a corresponding instance circuit cell of the plurality of instance circuit cells, and display on the display screen on the layout view at least a portion of shapes of the plurality of sets of circuit elements overlaid on the master circuit cell.

10. The system of claim 9, wherein the one or more processors is configured to:

display on the display screen a graphical user interface including a user selectable option for a search area on the layout; and responsive to selection of the user selectable option for the search area:

determine a perimeter of the search area; and display on the display screen on the layout view a portion of the plurality of sets of circuit elements overlaid on the master circuit cell that lies within the search area.

11. The system of claim 9, wherein the one or more processors is configured to:

display on the display screen a graphical user interface including a user selectable option for selecting a hierarchical level of the circuit; and responsive to selection of the hierarchical level of the circuit:

display on the display screen on the layout view only those sets of circuit elements, of the plurality of sets of circuit elements, overlaid on the master circuit cell that are included in hierarchical levels at and above the selected hierarchical level of the circuit.

12. The system of claim 9, wherein the one or more processors is configured to:

display on the display screen a graphical user interface including a user selectable option for viewing the master circuit cell in a foreground; and responsive to selection of the user selectable option for viewing the master circuit cell in the foreground:

display on the layout view elements of the master circuit cell over the plurality of sets of circuit elements.

13. The system of claim 9, wherein the one or more processors is configured to:

display on the display screen a graphical user interface including a user selectable option for displaying a full master view; and responsive to selection of the user selectable option for displaying the full master view:

display on the display screen on the layout view portions of the plurality of sets of circuit elements overlaid on the master circuit cell that lies within an area that corresponds to a perimeter of the master circuit cell.

14. The system of claim 9, wherein the one or more processors is configured to:

display on the display screen a graphical user interface with a list of identities of the plurality of instance circuit cells; and responsive to selection of an identity of a selected instance circuit cell of the plurality of instance circuit cell:

pan the layout view to include a portion of the circuit including the selected instance circuit cell.

15. The system of claim 9, wherein the one or more processors is configured to:

display on the display screen a graphical user interface that allows user selection of a set of circuit elements from the plurality of sets of circuit elements displayed on the layout view; and responsive to selection of the set of circuit elements from the plurality of sets of circuit elements:

pan the layout view to include the selected set of circuit elements and the corresponding instance circuit cell of the plurality of instance circuit cells.

16. The system of claim 9, wherein each set of the circuit elements includes at least one external circuit element that causes a design rule check error in relation to the respective instance circuit cell of the plurality of instance circuit cells.

17. A computer readable storage medium having instructions stored thereon which, when executed by a computer, cause the computer to execute a method, the method comprising:

providing a layout view of a circuit having a plurality of instance circuit cells of a master circuit cell;

providing a graphical user interface including a user selectable option for an overlay view; and responsive to selection of the user selectable option for an overlay view:

determining the plurality of instance circuit cells of the master circuit cell, determining a plurality of sets of circuit elements, each set of circuit elements including external circuit elements that overlap with a corresponding instance circuit cell of the plurality of instance circuit cells, and displaying on the layout view at least a portion of shapes of the plurality of sets of circuit elements overlaid on the master circuit cell.

18. The computer readable storage medium according to claim 17, the method further comprising:

providing a graphical user interface including a user selectable option for a search area on the layout; and responsive to selection of the user selectable option for the search area:

determining a perimeter of the search area, and displaying on the layout view a portion of the plurality of sets of circuit elements overlaid on the master circuit cell that lies within the search area.

19. The computer readable storage medium according to claim 17, the method further comprising:

providing a graphical user interface including a user selectable option for selecting a hierarchical level of the circuit; and responsive to selection of the hierarchical level of the circuit:

displaying on the layout view only those sets of circuit elements, of the plurality of sets of circuit elements, overlaid on the master circuit cell that are included in hierarchical levels at and above the selected hierarchical level of the circuit.

20. The computer readable storage medium according to claim 17, wherein each set of circuit elements including at least one external circuit element that causes a design rule check error in relation to the respective instance circuit cell of the plurality of instance circuit cells.

* * * * *